(12) United States Patent
Jager et al.

(10) Patent No.: US 8,242,467 B2
(45) Date of Patent: *Aug. 14, 2012

(54) LITHOGRAPHY SYSTEM AND PROJECTION METHOD

(75) Inventors: Remco Jager, Utrecht (NL); Aukje Arianne Annette Kastelijn, Eindhoven (NL); Guido de Boer, Someren (NL); Marco Jan Jaco Wieland, Delft (NL); Stijn Willem Karel Herman Steenbrink, Utrecht (NL)

(73) Assignee: Mapper Lithography IP B.V., CJ Delft (NL)

( * ) Notice: Subject to any disclaimer, the term of this patent is extended or adjusted under 35 U.S.C. 154(b) by 14 days.

This patent is subject to a terminal disclaimer.

(21) Appl. No.: 12/728,965

(22) Filed: Mar. 22, 2010

(65) Prior Publication Data
US 2010/0171046 A1     Jul. 8, 2010

Related U.S. Application Data

(63) Continuation of application No. 11/521,671, filed on Sep. 15, 2006, now Pat. No. 7,709,815.

(60) Provisional application No. 60/717,856, filed on Sep. 16, 2005.

(51) Int. Cl.
    *G21K 5/04*     (2006.01)
(52) U.S. Cl. ............ 250/492.2; 250/492.1; 250/492.3
(58) Field of Classification Search ........... 250/492.1, 250/492.2, 492.21, 492.22, 492.3
    See application file for complete search history.

(56) References Cited

U.S. PATENT DOCUMENTS

| 4,498,009 | A | 2/1985 | Reynolds | 250/492.1 |
| 6,668,103 | B2 | 12/2003 | Hosoi | 385/2 |
| 2002/0056816 | A1* | 5/2002 | Stark | 250/493.1 |
| 2004/0135983 | A1* | 7/2004 | Wieland et al. | 355/67 |
| 2006/0239309 | A1 | 10/2006 | Ariga et al. | 372/29.021 |
| 2008/0035057 | A1 | 2/2008 | Roux | 118/721 |

FOREIGN PATENT DOCUMENTS

JP     2002231172     2/2001

* cited by examiner

*Primary Examiner* — David A Vanore
*Assistant Examiner* — Nicole Ippolito
(74) *Attorney, Agent, or Firm* — Blakely, Sokoloff, Taylor & Zafman

(57) ABSTRACT

The inventions relates to a lithography system in which an electronic image pattern is delivered to a exposure tool for projecting an image to a target surface, said exposure tool comprising a control unit for controlling exposure projections, said control unit at least partly being included in the projection space of the said exposure tool, and being provided with control data by means of light signals, said light signals being coupled in to said control unit by using a free space optical interconnect comprising modulated light beams that are emitted to a light sensitive part of said control unit, wherein the modulated light beams are coupled in to said light sensitive part using a holed mirror for on axis incidence of said light beams on said light sensitive part, the hole or, alternatively, holes of said mirror being provided for passage of said exposure projections.

20 Claims, 2 Drawing Sheets

LITHOGRAPHY SYSTEM AND PROJECTION METHOD

CROSS-REFERENCE TO RELATED APPLICATION

The present patent application is a Continuation Application claiming the benefit of non-provisional application Ser. No. 11/521,671, filed Sep. 15, 2006, which issued on May 4, 2010 as U.S. Pat. No. 7,709,815, which application claims benefit of Provisional application No. 60/717,856, filed Sep. 16, 2005.

BACKGROUND OF THE INVENTION

The present invention relates to a lithography system for projecting an image pattern on to a target surface such as a wafer, wherein control data are coupled to a control unit for controlling exposure projections by means of light signals, thereby using a free space interconnect, in particular to a system wherein such control unit is included in close proximity to or within the projection space, more in particular to a multi-beam mask-less lithography system. The current invention in principle relates all the same to charged particle and to light projection based lithography systems Such a system is known, e.g. from the international patent publication WO2004038509 in the name of Applicant, i.e. from the particular embodiment provided by FIG. 14 thereof. The known system comprises a computer system for providing pattern data of an image to be projected by a so called beam column for projecting charged particles, in particular electrons on to a target surface such as a wafer and an inspection tool. The beam column comprises a vacuum chamber in which one or more charged particle sources are accommodated, which emit particles in a manner known per se, using amongst others an electric field for withdrawing particles from said source or sources.

The beam column further comprises charged particle optic means for converging an emitted bundle of charged particles, for splitting up the same into a multiplicity of charged particle beams, further referred to as writing beams, and forming exposure projections. A control unit for controlling the exposure projections is included in the form of charged particle optical means for shaping or directing such writing beams, here showing a blanker optical part or modulator array comprising blanking deflectors, as well as a writing deflector array for deflecting writing beams for the purpose writing of a pattern using writing beams not blanked by said blanking deflectors.

The blanker optic part, known per se, e.g. from international patent publication WO2004107050 in the name of Applicant, deflects, depending on a computer provided signal a writing beam away from a straight trajectory parallel with other writing beams, to such amount of inclination that no part of the writing beam effectively passes the opening provided for each writing beam in a stopping plate, thereby effecting an "off" state of the particular writing beam.

All optic parts in the beam column are shaped with an array of openings, the openings of the separate parts being mutually aligned so as to enable the passage of a writing beam in said column towards said target surface in a controlled manner. The known mask-less multi-beam system is further typically provided with blanking deflectors having both the source and the target surface arranged in a conjugate plane thereof, i.e. it may easily be combined with the subject matter of WO2004/0819010. In this manner the lithography system favourably realizes an optimal brightness of the source on the target surface. Also, in this manner a minimum amount of space is required for the blanker array.

The target surface for a writing beam is held on a stage included in the beam column. The stage, induced by an electronic control unit of the system, moves together with said surface perpendicularly relative to said emitted writing bundles, preferably solely in a direction transverse to a direction in which such writing bundles are finally deflected for writing purposes. Writing of a pattern by the known lithography system is thus effected by the combination of relative movement of the target surface and a timed "on" and "off" switching of a writing beam by said blanker optics upon signalling by said control unit, more in particular by a so-called pattern streamer thereof.

Signalling for on/off switching, i.e. modulating of a writing beam is in the related known system performed by using light optics. The blanker optics thereto comprises light sensitive parts such as photodiodes, for receiving light signals, which are converted into electronic signals, e.g. applying the measures as provided by the international patent publication WO2005010618 in the name of Applicant. The light signals are produced by electronic to light conversion by said control unit for the system, and are transported to the beam column by means an optical carrier, in casu a bundle of glass fibres that finally projects from "e.g. a transparent part of the vacuum boundary". Light signals are projected to said blanker optics using a lens system, which in the known system is disclosed to be comprised of a converging lens located in between a transmitter part and the light sensitive parts of deflectors included in the blanker optic part. The arrangement of deflector, light sensitive parts and light to electric conversion is produced using both so-called MEMS- and (Bi-) CMOS-technology. So as to prevent the use of mirroring parts, in the related known system the signalling light beams are projected from a far upper side relative to the blanking optic part, so as to achieve an angle of incidence of the pattern information carrying light signals on the light sensitive elements, as small as possible. The publication in which the related embodiment is comprised, teaches however, that other locations of projection may be realised when using mirrors for correcting the larger angles of incidence occurring at most of such alternative locations.

Although general set up of the above described lithography system has proven to be satisfactorily, drawbacks are noticed at the oblique illumination system disclosed, in that it suffers from non-optimal transmission of light, at least less than expected and in that it suffers from relatively large aberrations. The present invention therefore seeks to improve the known mask-less multi-beam lithography system in general, however, in particular as to the light optics system (LOS) thereof. The present invention further has for an object to improve the lithography system by either by increasing the light transmission efficiency thereof and/or by reducing the chance of aberrations in the light optic part thereof.

SUMMARY OF THE INVENTION

The present invention solves, at least to a significant extend eliminates the above said problems encountered in the lithography systems using a mirror for redirecting light beams, provided with one or more holes for letting through exposure, e.g. writing projections of said lithography system part. In particular a said free space optical interconnect of such systems according to the invention comprises a holey, i.e. holed mirror incorporated in the projection trajectory of said plurality of writing beams, wherein said mirror is arranged relative to said emitter part and said light sensitive elements to realize an on-axis, i.e. an at least virtually perpendicular incidence of said light beams on said light sensitive elements, said mirror being provided with at least one hole allowing passage of one or more of said writing beams.

Alternatively provided, in accordance with further insight underlying the present invention, a lithography system is attained, in which an electronic image pattern is delivered to a exposure tool for projecting an image to a target surface, said exposure tool comprising a control unit for controlling exposure projections, said control unit at least partly being included in the projection space of the said exposure tool, and being provided with control data by means of light signals, said light signals being coupled in to said control unit by using a free space optical interconnect comprising modulated light beams that are emitted to a light sensitive part of said control unit, wherein the modulated light beams are coupled in to said light sensitive part using holed, alternatively denoted holey mirror for on axis incidence of said light beams on said light sensitive part, the one or more holes of said mirror being provided for passage of said exposure projections.

Using a system according to the present invention minimizes the presence of aberrations by remaining on-axis at projection of light signals, without, at least noticeably interfering with, i.e. hampering the exposure projections of the exposure tool of the lithography system. With the presently claimed solution, the invention is realized in a new, in advance expectedly impossible, though at hindsight relatively simple to perform highly favorable manner.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be further elucidated by way of example in the following embodiments of a mask-less lithography system according to the current invention, shown in the attached drawings in which.

In the figures, corresponding structural features, i.e. at least functionally, are referred to by identical reference numbers.

DETAILED DESCRIPTION OF THE DRAWINGS

Figure 1:
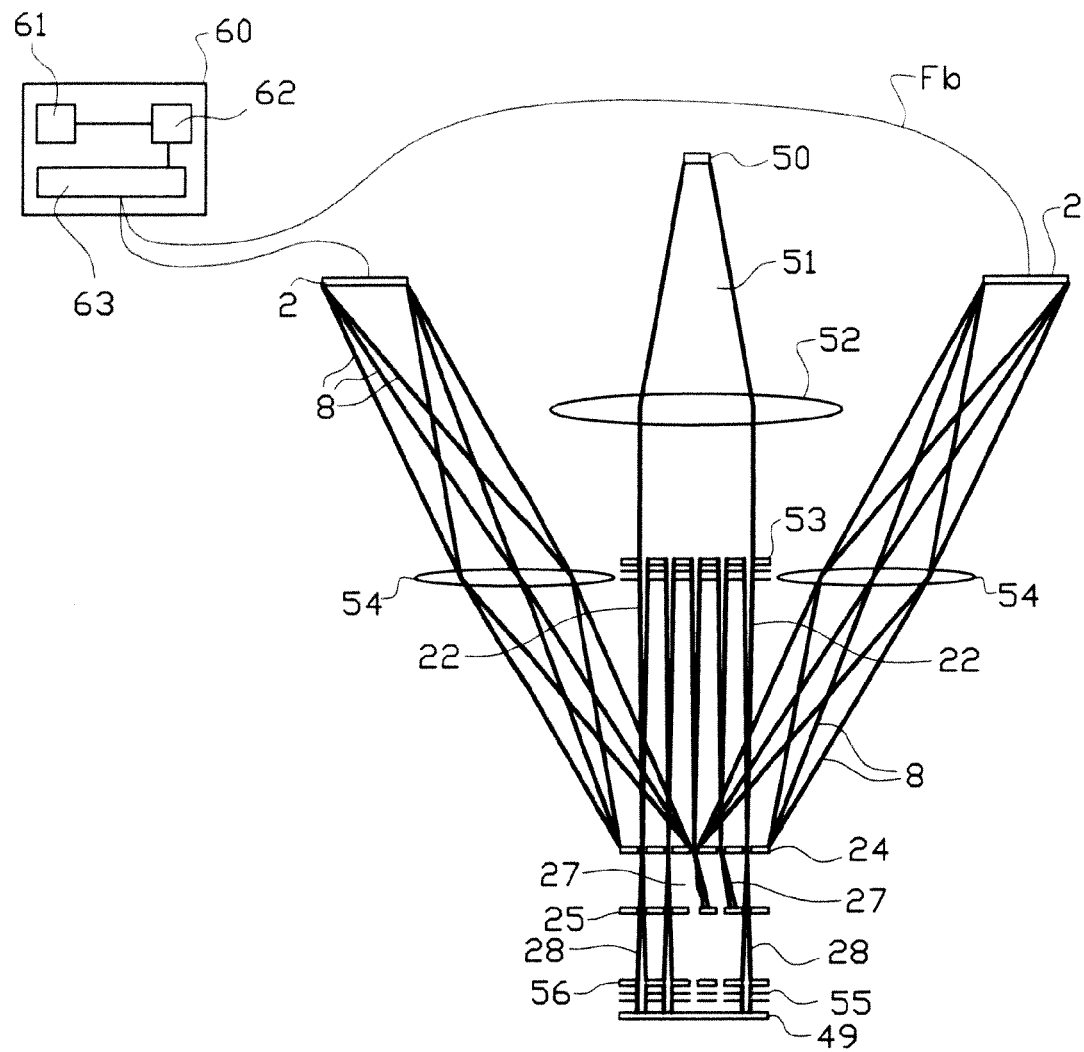
FIG. 1 is a schematic representation of a the prior art lithography system from which the present invention departs.

FIG. 1 represents an overall side view of the prior art lithography system that is improved by the current invention, in which at light emitter, or modulation means ends 2 of a light carrier Fb, in case embodied by optical fibers Fb, light beams 8 are projected on modulator array 24 using an optical system, represented by lenses 54. Modulated light beams 8 from each optical fiber end are projected on a light sensitive element, i.e. light sensitive part of a modulator of said modulator array 24. In particular, ends of the fibers Fb are projected on the modulator array. Each light beam 8 holds a part of the pattern data for controlling one or more modulators, the modulation thereof forming a signaling system for transferring pattern data based modulator array instructions for realizing a desired image on said target surface.

FIG. 1 also shows a beam generator 50, which generates a diverging charged particle beam 51, in this example an electron beam. Using an optical system 52, in casu an electron optical system, this beam 51 is shaped into a parallel beam. The parallel beam 51 impinges on beam splitter 53, resulting in a plurality of substantially parallel writing beams 22, directed to modulation array 24, alternatively denoted blanker array.

Using modulators in the modulation array 24, comprising electrostatic deflector elements, writing beams 27 are deflected away from the optical axis of the litho system, and writing beams 28 pass the modulators undeflected.

Using a beam stop array 25, the deflected writing beams 27 are stopped. The writing beams 28 passing stop array 25 are deflected at deflector array 56 in a first writing direction, and the cross section of each beam let is reduced using projection lenses 55. During writing, the target surface 49 moves with respect to the rest of the system in a second writing direction.

The lithography system furthermore comprises a control unit 60 comprising data storage 61, a read out unit and data converter 63, including a so-called pattern streamer. The control unit 60 is located remote from the rest of the system, for instance outside the inner part of a clean room. Using optical fibers Fb, modulated light beams 8 holding pattern data are transmitted to a projector which projects the ends of the fibers on to the modulation array 24.

Figure 2:
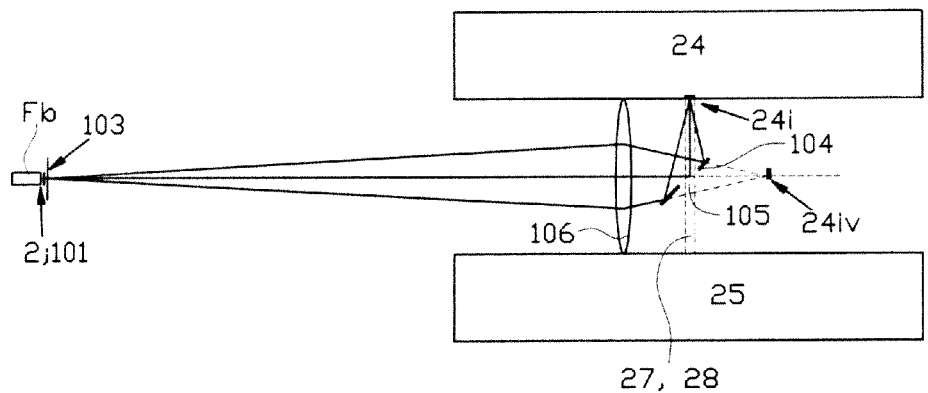
FIG. 2 is a schematic representation of an improved light optics system for the known lithography system according to a first embodiment.

FIG. 2 figuratively represents the light optic system of the improved lithography system according to a first embodiment. It entails the use of a holey mirror 104, which is applied for realizing an in-axis incidence of light beams 8 on the light sensitive elements of modulator array 24. The holey mirror thereto comprises one relatively large hole through which all for blanking deflected writing beams 27 and all undeflected writing beams 28 may pass, or a plurality of relatively small holes 105, one for each deflected or undeflected writing beam. According to preference, the mirror 104 comprises a substantially flat reflecting surface which is included in the system under angle of 45 degrees, so that while maintaining perpendicular incidence of light beams 8 on modulator 24, an axially minimal amount of space is required for the light optic system. With such minimized axial space requirement, design freedom is attained for locating the LOS either to the upper, or to the bottom side of the modulator array 24, which in turn enhances manufacturing freedom of the array 24, which is a highly complex part, manufactured at using CMOS and MEMS technology. With the use of a holey mirror 104, a focusing lens 106, preferably embodied by a lens system performing a focusing function, is included close as possible to the latter, at least closer to the mirror than to the fiber ends 2. By locating said focusing lens 106 in close proximity of the holey mirror 104, it is favorably realized that the holey mirror can be applied without undue loss in light signal intensity, which might otherwise be due to the presence of holes 105.

The array of fiber ends 2 are in accordance with the present invention completed with a micro lens array 101, forming a virtual fiber array 103, in fact an array of spots in the focal plane for the micro lenses 101. In line with a particular and independent aspect of the invention, a micro lens of the micro lens array 101 here according to preferred embodiment performs a magnifying, function on the light signals transmitted by a particular fiber of the fiber array Fb. The lens system according to the present invention thus sets forth a dual image system comprising a magnification of each signal by means of a micro-lens, and a subsequent focusing of the signal by means of said lens 106, common to all of the emitted light signals. In this manner favorably, independence is attained in setting, in casu increasing an effective spot size of each fibre, and setting, in casu decreasing a fiber pitch.

As to the first effect hereabove, it is according to the present invention preferred to cover an area as large as possible of a light sensitive element, so as to obviate the need for strong focus of the light signal 8, thereby reducing the chance of aberration and thereby reducing the need for further optical elements, which enhances the transmission of light, i.e. reduces the loss thereof. The desired and created light spot is not much larger than the light sensitive area so as to minimize loss of light by projecting light on surrounding, inert parts. This arrangement implies however that the projection of light is relatively sensitive for positioning errors of a light beam 8, in that small displacement thereof implies a reduction in the amount of light than is received by the relevant light sensitive element, e.g. photodiode. Thus, by sizing the incidence spot 24i larger, but not much larger than the light sensitive area, it is according to the invention prevented that expensive or complex optical elements are required in the free space interconnect of the LOS, while on the other hand sensitivity as to misalignment of the incident light beam part is reasonably reduced. In this respect misalignment may be due to actual conditions of the litho system, to structural inaccuracy, or to a combination thereof. As to the second effect mentioned here above, the pitch of the ends of fibers Fb is incompatible with, in particular larger than the pitch of the light sensitive elements on the modulator array 24, unless undue, and consequently uneconomic manufacturing efforts are made. With the present dual lens and dual imaging system independence in setting both parameters is attained in a favorable manner.

Figure 3:
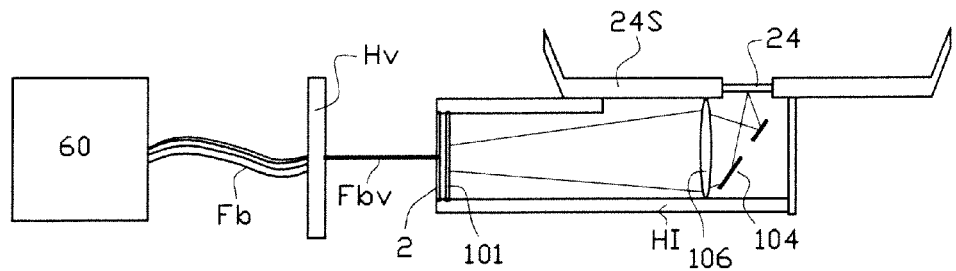
FIG. 3 is a schematic representation of a structural arrangement for the light optic system of FIG. 2 in the lithography system.

FIG. 3 represents the arrangement for preferred incorporation of the light optics system described along FIG. 2, in the lithography system, according to the invention. It shows a holder 24S for the above mentioned blanker or modulator array 24, by means of which holder the modulator array 24 is placed in a charged particle column. Such charged particle column is, together with the holder for holding a wafer or other kind of target surface, included in a housing Hv by means of which a vacuum condition for said column and target stage is realized. The array of fibers Fb is fed through an opening in a demountable part of said housing Hv, here by using a significant amount of vacuum compatible sealing material for realizing an air tight sealing of the fibres in said opening. An inner housing end part Fbv of said fibers is thereby also to a significant extend secured from outside mechanical impulses that might act thereon. The end part Fbv of the array of fibers is at its end 2 further secured mechanically to a housing Hl for the lens and mirror part of the light optics system. In turn the housing Hl is secured to said modulator array holder 24S. In this manner it is in a favorable, mechanical manner secured that the positions of the fiber ends 2 and the modulator array, in particular the light sensitive areas thereof are fixed relative to one another. In turn, the array holder 24S is connected to a not depicted frame for elements such as collimator 52, and splitter 53, and as further discussed under FIG. 1, constituting the charged particle column.

As illustration in one dimension in FIG. 3, the holey mirror 104 covers the entire area of a modulator array, while in the same manner the lens 106 covers the entire area of the tilted mirror 104. The lens 106 is thereby incorporated axially in close proximity to the holder 24S.

It may be clear from the above, that the principles of the dual lens system, mechanical fixation of a lens housing Hl to the blanker 24 and the specific application of a holey mirror 104 may all be applied independently from one another. Further to the latter, the principle of dual imaging can be applied while using an off-axis projection instead of the presently preferred perpendicular projection.

Figure 4:
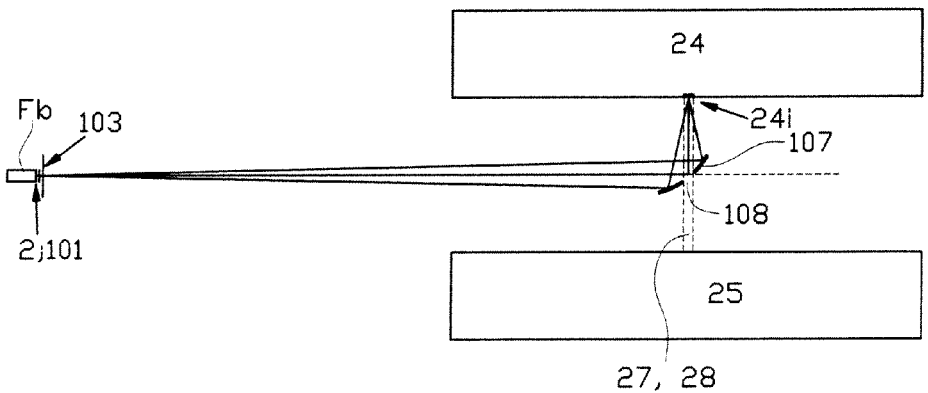
FIG. 4 is a schematic representation of an improved light optics system for the known lithography system according to a second embodiment.

FIG. 4 figuratively represents the light optic system of the improved lithography system according to a second embodiment. It entails the use of a holey mirror 107, which is applied for realizing an in-axis incidence of light beams 8 on the light sensitive elements of modulator array 24. The holey mirror thereto comprises one relatively large hole 108 through which all for blanking deflected writing beams 27 and all undeflected writing beams 28 may pass, or a plurality of relatively small holes, one for each deflected or undeflected writing beam. According to preference, the mirror 104 comprises a focusing reflecting surface, said reflecting surface in particular is placed at an angle for reflecting the incident light beams 8 towards the modulator 24 and said reflecting surface in particular being a concave surface for simultaneous focusing the incident light beams 8 onto the modulator 24.

With the use of a holey mirror with a focusing reflecting surface 107, a focusing lens 106, may be omitted. It is favourably realized that any loss in light signal intensity, in particular due to reflections at the surfaces of the focusing lens 106, can be further reduced.

Furthermore, it is realized that the focusing element in this second embodiment, in particular the concave reflecting surface of the holey mirror 107, can be much closer to the modulator array 24, than the lens 106 in the first embodiment. Due to this close distance, the light optical system of this second embodiment can be designed with a larger numerical aperture and thus with an increased resolving power of the light optical system.

Also in the second embodiment of FIG. 4, the array of fiber ends 2 are completed with a micro lens array 101, forming a virtual fiber array 103, in fact an array of spots in the focal plane for the micro lenses 101. A micro lens of the micro lens array 101 performs a magnifying function on the light signals transmitted by a particular fiber of the fiber array Fb. The concave reflecting surface of the holey mirror 107 according to the second embodiment thus sets forth a dual image system comprising a magnification of each signal by means of a micro-lens, and a subsequent focusing of the signal by means of said concave reflecting surface of the holey mirror 107, common to all of the emitted light signals.

Furthermore, it is realized that a holey mirror with a focusing reflecting surface 107 as shown in FIG. 4 may also be combined with a focusing lens 106 as shown in FIG. 3. In this case the focusing element 106, 107 comprises two optical parts and both optical parts may contribute to the focusing effect and/or can be used to further reduce optical aberrations.

Apart from the concepts and all pertaining details as described in the preceding the invention also relates to all features as defined in the following set of claims as well as to all details as may be directly and unambiguously be derived by one skilled in the art from the above mentioned figures, related to the invention. In the following set of claims, rather than fixating the meaning of a preceding term, any reference numbers corresponding to structures in the figures are for reason of support at reading the claim, included solely as an exemplary meaning of said preceding term.

The invention claimed is:

1. A lithography system in which an electronic image pattern is delivered to a charged particle exposure tool for projecting an image on a target surface, said exposure tool including a frame for elements constituting a charged particle projection column, and said exposure tool comprising a vacuum housing for housing said frame and particle column, and said lithography system comprising a control unit external to said vacuum housing for controlling exposure projections by means of control data, said control data being provided to a modulator for modulating charged particle beams generated in said exposure tool, said control data being provided via an optical interconnect conveying modulated light signals, said beam modulator thereto comprising an array of deflectors for modulating projection beams and light sensitive areas for receiving said control data, and said beam modulator at least partly extending in a charged particle projection space of said exposure tool, and being included in said element frame via a modulator holder, said control data finally being coupled in to said modulator using a free space optical interconnect for emitting modulated light beams to said light sensitive parts of said beam modulator, said optical interconnect further comprising an array of fibers coupled into said tool via a part of said vacuum housing, wherein an inner vacuum housing end part of said fibers is at its end mechanically secured to a light optics housing which in turn is secured to said modulator holder.

2. A system according to claim 1, wherein said feed through housing part is demountable.

3. A system according to claim 1, wherein said inner vacuum housing end part of said fibers is secured from outside mechanical impulses.

4. A system according to claim 1, wherein a feed through of an array of fibers in said vacuum housing realizes an air tight sealing by using a sealing material.

5. A system according to claim 1, wherein said light optics housing secures the positions of fiber ends of said array of fibers relative to light sensitive areas of the modulator.

6. A system according to claim 1, wherein the optics housing houses a lens part of the light optics interconnect.

7. A system according to claim 1, wherein the optics housing houses a mirror part of the light optics interconnect.

8. A system according to claim 7, wherein said mirror is holed.

9. A lithography system according to claim 1, in which an electronic image pattern is delivered to an exposure tool formed by a writing tool by means of light projection, utilizing an exposure projection, in particular a multi beam system for mask-less projection of a pattern on to an exposure surface, comprising a vacuum housing within which such writing tool is incorporated,
a multi beam projection source being present, creating a plurality of writing beams for writing said pattern,
which writing beams are directed to an blanker array comprising a control unit with individual controllers such as electrostatic blanker deflectors for individually controlling a writing beam in accordance received pattern information, in particular deflecting a writing beam or not, to a beam stopping part,
a light optical system comprising light transmitting parts being present for transmitting pattern information signals to such controllers, in particular blanker deflectors,
which controllers comprise light sensitive elements for receiving such modulated light beams, such light sensitive elements preferably being accommodated within near vicinity of the deflectors,
said light optical system comprising a free space optical interconnect, forming a light optical data carrier system, transmitting pattern data carrying, modulated light beams towards said controllers,
which free space optical interconnect comprises an emitter part emitting free space interconnect, pattern data carrying light beams to said light sensitive elements, wherein
said free space optical interconnect comprises a holey mirror, incorporated in the projection trajectory of said plurality of writing beams,
said mirror being arranged relative to said emitter part and said light sensitive elements to realize an on-axis incidence of said light beams on said light sensitive elements,
and said mirror being provided with at least one hole allowing passage of one or more of said writing beams.

10. A system according to claim 1, in which an emitting part is incorporated to emit said light beams at least virtually perpendicular relative to a direction of said exposure projection.

11. A system according to claim 10, wherein said writing tool preferably utilizing a multi beam system for preferably mask-less projection of a pattern on to an exposure surface, comprising a vacuum housing within which such lithographic system is incorporated.

12. A system according to claim 1, in which said free space interconnect is included at a down stream side of the control unit.

13. A system according to claim 1, in which said free space interconnect, including an emitter and said holey mirror is included in a housing that is mechanically connected to the control unit, in particular a blanker array, more in particular via a holder therefore.

14. A system according to claim 1, in which a focusing lens is incorporated in said free space optical interconnect in near proximity to said holey mirror, in particular significantly nearer to said mirror than to said emitter, said lens in particular being common to all of the light beams emitted by said emitter.

15. A system according to claim 1, in which a micro lens is incorporated in said free space optical interconnect, in particular thereby forming said emitter, in close proximity to a light carrier end, in particular significantly closer to said carrier end than to said holey mirror, in particular each light carrier composing part such as an optic fiber end being provided with a micro lens.

16. A system according to claim 1, wherein the free space optical interconnect comprises a micro lens and a focusing lens common to a possible plurality of micro-lens completed fibers, the micro lens therein magnifying a fiber transmitted light signal, and the focusing lens de-magnifying the entirety of light signals transmitted by said possible plurality of fibers.

17. A system according to claim 1, wherein said free space optical interconnect is included in between a control unit formed by a blanker array for blanking writing beams, and a stopping plate for stopping writing beams deflected by said blanker array.

18. A system according to claim 1, wherein one or more light signal carriers are fed through a vacuum wall for the exposure tool using vacuum compatible sealing material, and are with end parts thereof subsequently mechanically coupled to a free space optical connect housing located in a vacuum space for the charged particle beam column.

19. A lithography system in which an electronic image pattern is delivered to a charged particle exposure tool for projecting an image on a target surface, said exposure tool including a frame for elements constituting a charged particle projection column, and said exposure tool comprising a vacuum housing for housing said frame and particle column, and said lithography system comprising a control unit external to said vacuum housing for controlling exposure projections by means of control data, said control data being provided to a modulator for modulating charged particle beams generated in said exposure tool, said control data being provided via an optical interconnect conveying modulated light signals, said beam modulator thereto comprising an array of deflectors for modulating projection beams and light sensitive areas for receiving said control data, and said beam modulator at least partly extending in a charged particle projection space of said exposure tool, and being included in said element frame via a modulator holder, said control data finally being coupled in to said modulator using an optical interconnect for transmitting light beams to said light sensitive parts of said beam modulator, said optical interconnect further comprising an array of fibers coupled into said tool via a part of said vacuum housing, wherein the array of fibers is fed through an opening in a part of said housing by using an amount of vacuum compatible sealing material for realizing an air tight sealing of the fibers in the opening.

20. Lithography system according to claim 19, wherein the array of fibers is fed through the opening in a demountable part of said housing.

\* \* \* \* \*